United States Patent [19]
Shin et al.

[11] Patent Number: 5,378,932
[45] Date of Patent: Jan. 3, 1995

[54] LEVEL SHIFTING CIRCUIT

[75] Inventors: Yasuhiro Shin; Tatsuya Kimura, both of Tokyo, Japan

[73] Assignee: Oki Electric Industry, Co., Ltd., Tokyo, Japan

[21] Appl. No.: 50,612

[22] Filed: Apr. 22, 1993

[30] Foreign Application Priority Data

Apr. 23, 1992 [JP] Japan ................................. 4-104602

[51] Int. Cl.⁶ ............................................. H03K 17/60
[52] U.S. Cl. ...................................... 327/333; 326/68; 327/389; 327/391; 327/63
[58] Field of Search ................ 307/475, 355, 576, 255, 307/264

[56] References Cited

U.S. PATENT DOCUMENTS

| 4,996,443 | 2/1991 | Tateno | ................. | 307/475 |
| 5,128,556 | 7/1992 | Hirakata | ............... | 307/475 |
| 5,179,292 | 1/1993 | Lee | ..................... | 307/255 |

FOREIGN PATENT DOCUMENTS

2-268516  2/1990  Japan .

Primary Examiner—Margaret Rose Wambach
Attorney, Agent, or Firm—Spencer, Frank & Schneider

[57] ABSTRACT

A level shifting circuit according to the present invention has first and second voltage terminals, first and second input terminals, an output terminal, a level converter circuit and an output circuit. The level converter includes first, second and third nodes, first, second, third and fourth transistors and an resistive element. The first transistor has a first electrode connected to the first voltage terminal, a second electrode connected to the first node and a control electrode connected to the first input terminal. The second transistor has a first electrode connected to the first voltage terminal, a second electrode connected to the second node and a control electrode connected to the second input terminal. The third transistor has a first electrode connected to the second voltage level, a second electrode connected to the first node and a control electrode connected to the second node. The resistive element connected between the second and third nodes. The fourth transistor has a first electrode connected to the second voltage level, a second electrode connected to the third node and a control electrode connected to the first node. The output circuit includes fifth and sixth transistors. The fifth transistor has a first electrode connected to the first voltage terminal, a second electrode connected to the output terminal and a control electrode connected to the second node. The sixth transistor has a first electrode connected to the second voltage terminal, a second electrode connected to the output terminal an a control electrode connected to the third node.

23 Claims, 10 Drawing Sheets

1

LEVEL SHIFTING CIRCUIT

CROSS REFERENCE TO RELATED APPLICATION

This application claims the priority of Japanese Application Serial No. 104602/1992, filed Apr. 23, 1993, the subject matter of which is incorporated herein by reference.

BACKGROUND OF THE INVENTION

The present invention relates to a level shifting circuit suitable for use in an LCD driver or the like, and more specifically to a level shifting circuit for producing an output signal having a potential level different from a potential level of an input signal.

A conventional level shifting circuit has been disclosed in Japanese Patent Application Laid-Open Publication No. 268516/90, for example. The disclosed level shifting circuit comprises a level converter circuit and an output circuit. The level converter circuit comprises six transistors and a resistor.

In order to reduce the power consumed by the level shifting circuit, it is necessary to adjust the value of the resistor. However, a limitation is imposed on the adjustment of the resistance value in connection with the threshold voltage of each transistor.

A reduction in the consumption power of the level shifting circuit has been prevented by this limitation.

SUMMARY OF THE INVENTION

A level shifting circuit according to the present invention has first and second voltage terminals, first and second input terminals, an output terminal, a level converter circuit and an output circuit. The level converter includes first, second and third nodes, first, second, third and fourth transistors and a resistive element. The first transistor has a first electrode connected to the first voltage terminal, a second electrode connected to the first node and a control electrode connected to the first input terminal. The second transistor has a first electrode connected to the first voltage terminal, a second electrode connected to the second node and a control electrode connected to the second input terminal. The third transistor has a first electrode connected to the second voltage level, a second electrode connected to the first node and a control electrode connected to the second node. The resistive element connected between the second and third nodes. The fourth transistor has a first electrode connected to the second voltage level, a second electrode connected to the third node and a control electrode connected to the first node. The output circuit includes fifth and sixth transistors. The fifth transistor has a first electrode connected to the first voltage terminal, a second electrode connected to the output terminal and a control electrode connected to the second node. The sixth transistor has a first electrode connected to the second voltage terminal, a second electrode connected to the output terminal and a control electrode connected to the third node.

DETAILED DESCRIPTION OF THE PREFERRED EMBODIMENTS

Figure 1:
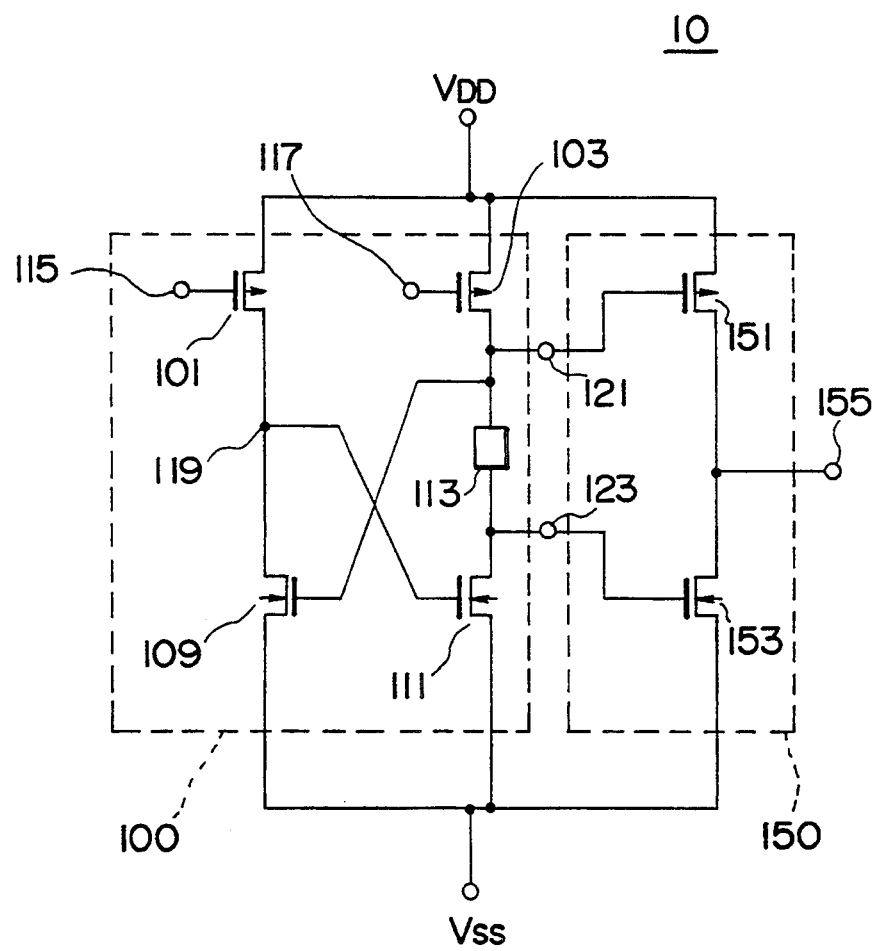
FIG. 1 is a circuit diagram showing a level shifting circuit according to a first embodiment of the present invention.
Figure 2:
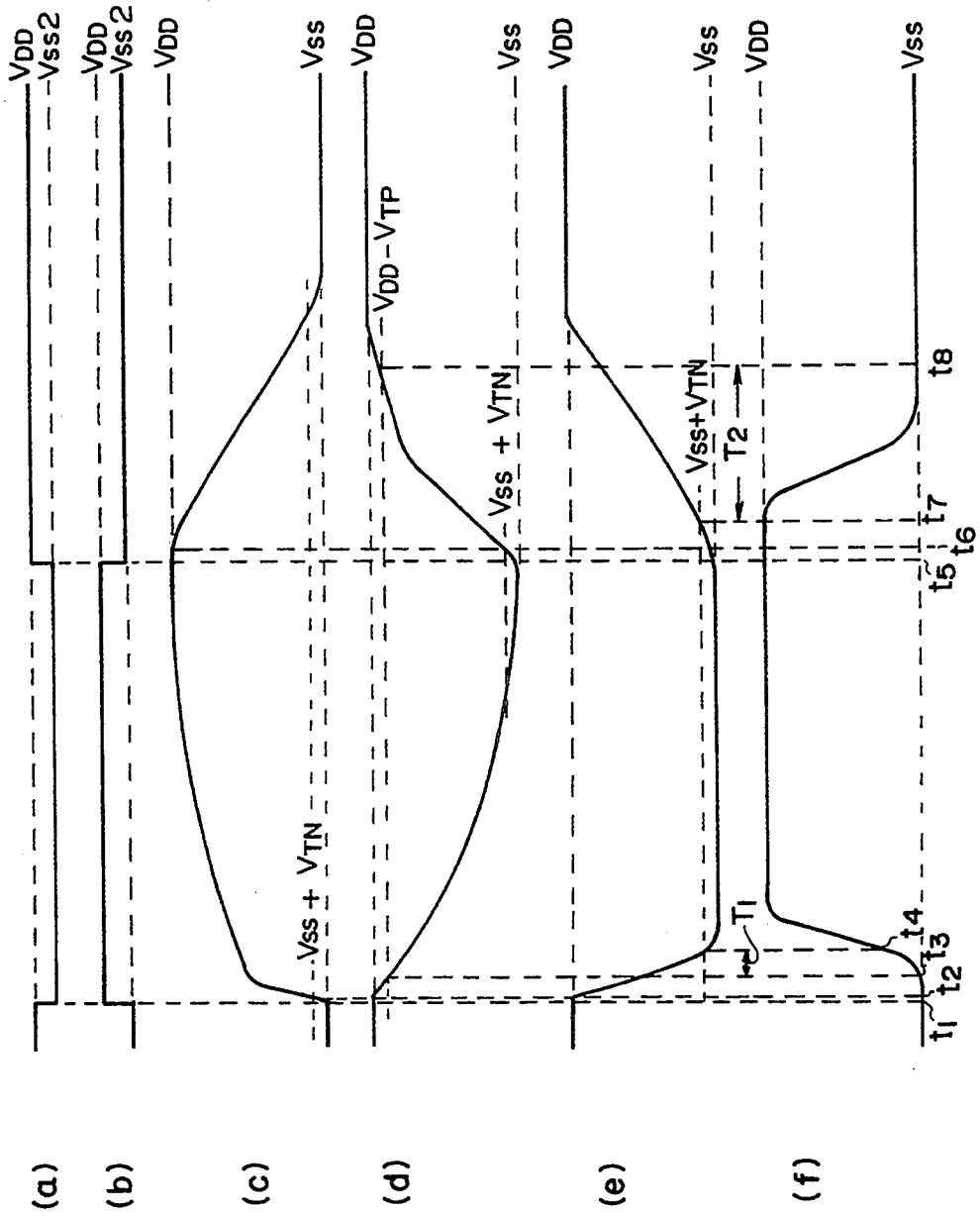
FIG. 2 is a timing chart for describing the operation of the level shifting circuit shown in FIG. 1.

FIG. 1 is a circuit diagram showing a level shifting circuit according to a first embodiment of the present invention. FIG. 2 is a timing chart for describing the operation of the level shifting circuit shown in FIG. 1. The first embodiment will hereinafter be described with reference to FIGS. 1 and 2.

The level shifting circuit 10 according to the first embodiment comprises a level converter circuit 100 and an output circuit 150 comprised of an inverter. The level converter circuit 100 comprises first and second P-channel MOSFETs (hereinafter called "P-MOSs") 101 and 103, third and fourth N-channel MOSFETs (hereinafter called "N-MOSs") 109 and 111, and a resistance means (resistive element) 113. The source electrodes of the first and second P-MOSs 101 and 103 are electrically connected to a first power source potential or voltage $V_{DD}$. The gate electrode of the first P-MOS 101 and the gate electrode of the second P-MOS 103 are electrically connected to a first input terminal 115 and a second input terminal 117 respectively. The drain electrode of the first P-MOS 101 and the drain electrode of the second P-MOS 103 are electrically connected to a first node 119 and a second node 121 respectively. One end of the resistance means 113 is electrically connected to the second node 121.

The level converter circuit 100 has a third N-MOS 109 whose drain, source and gate electrodes are electrically connected to the first node 119, a second power source voltage $V_{SS}$ and the second node 121 respectively, and a fourth N-MOS 111 whose drain, source and gate electrodes are electrically connected to the other end of the resistance means 113 (a third node 123), the second power source voltage $V_{SS}$ and the first node 119 respectively.

The output circuit 150 comprises an inverter composed of both a fifth P-MOS 151 whose source, drain and gate electrodes are electrically connected to the first power source voltage $V_{DD}$, an output terminal 155 and the second node 121 respectively, and a sixth N-MOS 153 whose source, drain and gate electrodes are electrically connected to the second power source voltage $V_{SS}$, the output terminal 155 and a third node 123 respectively.

The operation of the level shifting circuit according to the present embodiment will now be described with reference to FIGS. 1 and 2.

Complementary input signals (a) and (b) having a voltage or potential level $V_{DD}-V_{SS2}$ whose amplitude is smaller than that of a potential level $V_{DD}-V_{SS}$, are applied to the first and second input terminals 115 and 117 respectively. A description will now be made of specific values employed in the present embodiment. The $V_{DD}$, $V_{SS2}$ and $V_{SS}$ levels are respectively 0 V, $-5$ V and $-40$ V. The value of saturation current at the time that the gate voltage of the first P-MOS 101 is $-40$ V, is equal to that of saturation current at the time that the gate voltage of the third N-MOS 109 is 0 V. This saturation current value is about 1.2 mA. Further, the width and length of the gate of the first P-MOS 101 are respectively 150 μm and 6 μ, whereas the width and length of the gate of the third N-MOS 109 are respectively 4 μm and 6 μm. The width and length of the gate of the second P-MOS 103 are equal to those of the gate of the first P-MOS 101. The value of the resistance means 113 is 30 kΩ. Since the fourth N-MOS 111 needs a current driving capability corresponding to the extent that the current is not limited when it is operated, the width and length of the fourth N-MOS 111 are set to 10 μm and 6 μm respectively. Further, the width and length of the gate of the fifth P-MOS 151 are set to 40 μm and 6 μm respectively, whereas the width and length of the gate of the sixth N-MOS 153 are set to 20 μm and 6 μm respectively.

During a time interval prior to a time or timing $t_1$ as shown in FIG. 2, a voltage or potential of the input signal (a) at the first input terminal 115 is brought to the $V_{DD}$ level (hereinafter called an "H" level) (i.e., the first input terminal 115 is supplied with an "H" level input signal). Further, a potential of the input signal (b) at the second input terminal 117 is brought to the $V_{SS2}$ level (hereinafter called an "L" level)(i.e., the second input terminal 117 is supplied with an "L" level input signal). At this time, the first P-MOS 101 is in an OFF state and the second P-MOS 103 is in an ON state. Since the second P-MOS 103 is in the ON state, the second node 121 is electrically connected to the first power source voltage $V_{DD}$ via the second P-MOS 103 and the potential at the second node 121 is higher than the $V_{SS}$ level. When the potential at the second node 121 is raised a threshold voltage $V_{TN}$ or higher of an NMOS transistor as seen from the $V_{SS}$ level, the third N-MOS 109 is brought to an ON state. Thus, the second power source voltage $V_{SS}$ and the first node 119 are electrically connected to each other through the third N-MOS 109. Since the first P-MOS 101 is in the OFF state, a potential (c) at the first node 119 is brought to the $V_{SS}$ level as shown in FIG. 2. Since the first node 119 is maintained at the $V_{SS}$ level, the fourth N-MOS 111 is brought to an OFF state. Accordingly, the second node 121 and the third node 123 are electrically disconnected from the power source voltage $V_{SS}$ and connected to the first power source voltage $V_{DD}$ alone through the second P-MOS 103 and the resistance means 113. Therefore, a potential (d) at the second node 121 and a potential (e) at the third node 123 are brought to the $V_{DD}$ level as shown in FIG. 2.

The input signals are next inverted at the timing $t_1$ as shown in FIG. 2. That is, since the potential (a) at the first input terminal 115 and the potential (b) at the second input terminal 117 are respectively brought to the "L" and "H" levels, the first and second P-MOSs 101 and 103 are respectively brought to the OFF state. At this time, the first node 119 is electrically connected to the first power source voltage $V_{DD}$ via the first P-MOS 101 and to the second power source voltage $V_{SS}$ via the third N-MOS 109. Since the first P-MOS 101 and the third N-MOS 109 are substantially identical in load driving capability to each other, the potential (c) at the first node 119 starts to increase up to a potential equal substantially to one-half the $V_{DD}-V_{SS}$ level in dependence on the value of current determined by the first P-MOS 101 as shown in FIG. 2.

On the other hand, the second node 121 and the third node 123 are maintained at the $V_{DD}$ level because the second P-MOS 103 and the fourth N-MOS 111 are both in the OFF state.

When the potential (c) at the first node 119 becomes higher than $V_{SS}+V_{TN}$ at a timing $t_2$, the fourth N-MOS 111 is brought to the ON state. Thus, the potentials (d) and (e) at the second and fourth nodes 121 and 123 starts to decrease up to the $V_{SS}$ level. Since the load driving capability of the third N-MOS 109 is gradually reduced in proportion to a decrease of the potential at the second node 121, the potential (c) at the first node 119 increases to the $V_{DD}$ as shown in FIG. 2.

When the potential (d) at the second node 121 becomes lower than $V_{SS}+V_{TN}$ (between timings $t_4$ and $t_5$), the third N-MOS 109 2[s completely brought to the OFF state. Therefore, the potential (c) at the first node 119 is brought to the $V_{DD}$ level and the potentials (d) and (e) at the second and third nodes 121 and 123 are both brought to the $V_{SS}$ level.

The input signals are inverted again at the timing $t_5$. That is, since the potential (a) at the first input terminal 115 and the potential (b) at the second input terminal 117 reach the "H" and "L" levels respectively, the first P-MOS 101 and the second P-MOS 103 are turned OFF. Since the first P-MOS 101 and the third N-MOS 109 are both in the OFF state, the first node 119 is maintained at the $V_{DD}$ level. Since, on the other hand, the second P-MOS 103 and the fourth N-MOS 111 are both in the ON state, the potentials (d) an (e) at the second node 121 and the third node 123 respectively start to increase up to predetermined potentials obtained by dividing the $V_{DD}-V_{SS}$ level in accordance with the ratio in resistance between the second P-MOS 103, the resistance means 113 and the fourth N-MOS 111.

Since the potential (d) at the second node 121 becomes higher than $V_{SS}+V_{TN}$ at a timing $t_6$ as shown in FIG. 2, the third N-MOS 109 is brought to the ON state. Accordingly, the potential (c) at the first node 119 starts to drop to the $V_{SS}$ level in accordance with the value of current determined by the third N-MOS 109. As a result, the load driving capability of the fourth N-MOS 111 is reduced with an decrease in the potential at the first node 119. The potentials (d) and (e) at the second and third nodes 121 and 123 increases up to $V_{DD}$ as shown in FIG. 2. Thereafter, the fourth N-MOS 111 is completely brought to the OFF state when the potential (c) at the first node 119 becomes lower than $V_{SS}+V_{TN}$. Further, the potentials (d) and (e) at the second and third nodes 121 and 123 reach the $V_{DD}$ level and the first node 119 is brought to the $V_{SS}$ level.

The operation of the output circuit 150 will next be described with reference to FIGS. 1 and 2.

Since each of the potentials (d) and (e) at the second and third nodes 121 and 123 reaches the $V_{DD}$ level during the time interval prior to the timing $t_1$, the fifth P-MOS 151 and the sixth N-MOS 153 are respectively brought to the ON and OFF states. Further, a potential (f) at the output terminal 155 is brought to the $V_{SS}$ level.

The fourth N-MOS 111 is turned ON and the potential (e) at the third node 123 abruptly drops at the timing $t_2$ as illustrated in FIG. 2. On the other hand, since the value of the resistance means 113 is large, the potential (d) at the second node 121 is slowly lowered as depicted in FIG. 2.

When the potential (d) at the second node 121 is lower than $V_{DD} - V_{TP}$ (where $V_{TP}$ represents a threshold voltage of a P-MOS transistor) at a timing $t_3$ as shown in FIG. 2, the fifth P-MOS 151 is brought to the ON state. Thus, the potential (f) at the output terminal 155 increases. Since, however, the sixth N-MOS 153 is also in the ON state, current flows into the second power source voltage $V_{SS}$ from the first power source voltage $V_{DD}$. The consumption current is produced during a time interval $T_1$ between the timing $t_3$ and a timing $t_4$ at which the potential (e) at the node 123 reaches $V_{SS} + V_{TN}$ or less as shown in FIG. 2. In order to shorten the time interval $T_1$, the value of the resistance means 113 is increased so that the potential (d) at the second node 121 is slowly lowered and the timing $t_3$ may be brought close to the timing $t_4$. In the level shifting circuit according to the present invention, no limitation is imposed on the resistance value as in the conventional level shifting circuit. Even if the resistance value increases, the level shifting circuit can be reliably operated.

When the input signals are inverted again at the timing $t_5$, the potential (e) at the third node 123 increases as shogun in FIG. 2. When the potential (e) reaches $V_{SS} + V_{TN}$ or higher at a timing $t_7$, the sixth N-MOS 153 is brought to the ON state. Thus, the potential (f) at the output terminal 155 is lowered as shown in FIG. 2. Afterwards, when the potential (d) at the second node 121 reaches $V_{DD} - V_{TP}$ or above at a timing $t_8$ as shown in FIG. 2, the fifth P-MOS 151 is brought to the OFF state. Accordingly, the consumption current is produced during a time interval $T_2$ between the timings $t_7$ and $t_8$. Since, however, the value of the resistance means 113 is set to a large value as described above, the potential (e) at the third node 123 is slowly raised. Thus, the timing $t_7$ approaches the timing $t_8$. That is, since the time interval $T_2$ becomes short, the current to be used by the level shifting circuit can be reduced.

Figure 3:
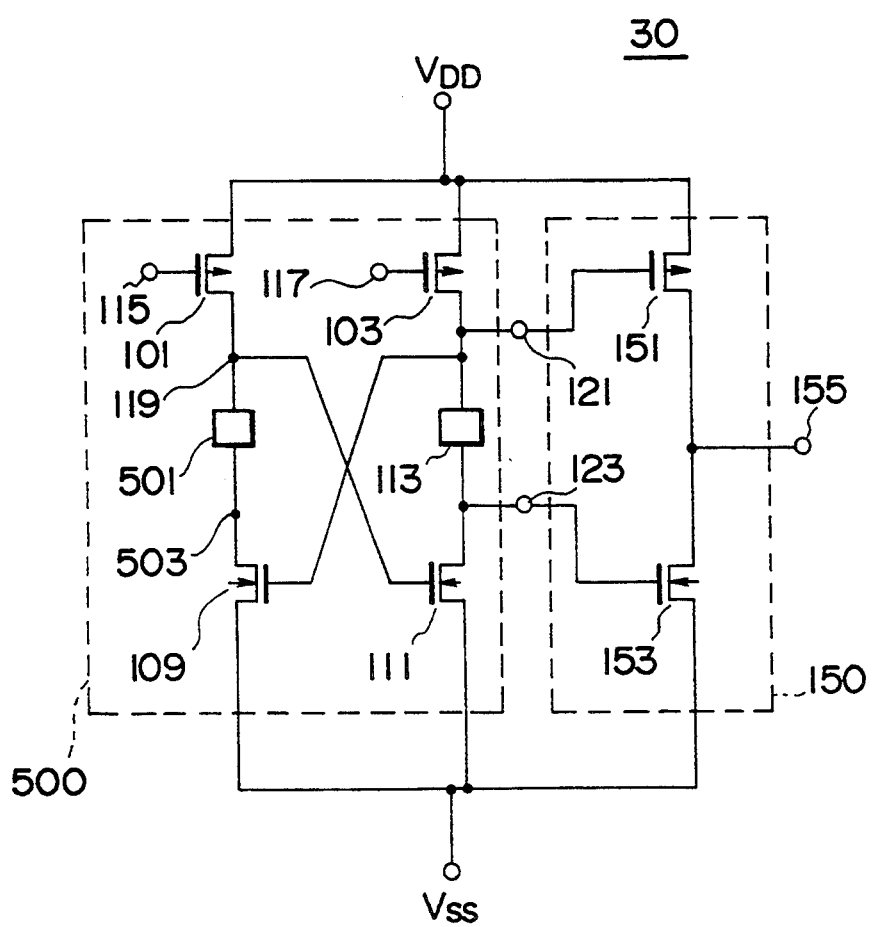
FIG. 3 is a circuit diagram illustrating a level shifting circuit according to a second embodiment of the present invention.

FIG. 3 is a circuit diagram showing a level shifting circuit 30 according to a second embodiment of the present invention. The same elements of structure as those shown in FIG. 1 are identified by the same reference numerals and their description will therefore be omitted.

The level shifting circuit 30 according to the second embodiment is identical in structure to the level shifting circuit 10 according to the first embodiment except that a resistance means 501 is provided between a first node 119 and the drain electrode (a fourth node 503) of a third N-MOS 109. The level shifting circuit 30 according to the second embodiment is substantially identical in operation to the level shifting circuit 10 according to the first embodiment. For example, the rates and timings at which the potentials at the first node 119, a second node 121 and a third node 123 increase and decrease, are slightly different from those in the first embodiment owing to the existence of the resistance means 501.

Figure 4:
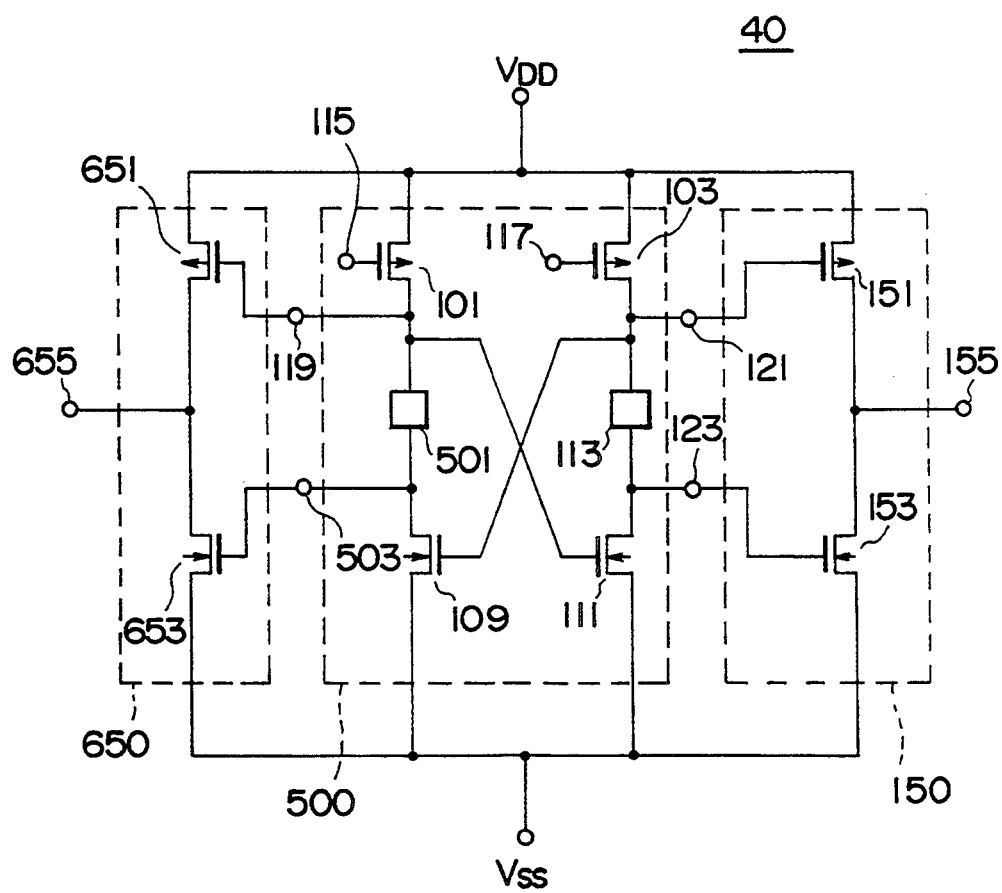
FIG. 4 is a circuit diagram depicting a level shifting circuit according to a third embodiment of the present invention.

FIG. 4 is a circuit diagram illustrating a level shifting circuit 40 according to a third embodiment of the present invention. The same elements of structure as those shown in FIG. 3 are identified by the same reference numerals and their description will therefore be omitted.

In the level shifting circuit 40 according to the third embodiment, an output circuit 650 is further provided in addition to the level shifting circuit 30 according to the second embodiment. The output circuit 650 is identical in structure to the output circuit 150 and has first and fourth nodes 119 and 503 used as inputs. The output circuit 650 comprises a seventh P-MOS 651 whose source, drain and gate electrodes are respectively electrically connected to a first power source voltage $V_{DD}$, an output terminal 655 and the first node 119, and an eighth N-MOS 653 whose source, drain and gate electrodes; are respectively electrically connected to a second power source voltage $V_{SS}$, the output terminal 655 and the third node 503. A level converter circuit 500 and an output circuit 150 employed in the third embodiment are identical in operation to those employed in the second embodiment. Further, the operation of the output circuit 650 can be easily determined or judged from that of the level converter circuit 500 and its detailed description will therefore be omitted. Incidentally, the relationship between the levels at first and second input terminals 115 and 117 and the levels output from the output terminals 155 and 655 are shown in Table 1 given below.

TABLE 1

| First input terminal 115 | Second input terminal 117 | Output terminal 155 | Output terminal 655 |
|---|---|---|---|
| H | L | $V_{SS}$ | $V_{DD}$ |
| L | H | $V_{DD}$ | $V_{SS}$ |

As is apparent from Table 1, when the first input terminal 115 and the second input terminal 117 are of "H" and "L" levels respectively, the output terminals 155 and 655 are brought to a $V_{SS}$ Level and a $V_{DD}$ level respectively. When, on the other hand, the first input terminal 115 and the second input terminal 117 are of the "L" and "H" levels respectively, the output terminal 155 is brought to the $V_{DD}$ level and the output terminal 655 is brought to the $V_{SS}$ level.

Figure 5:
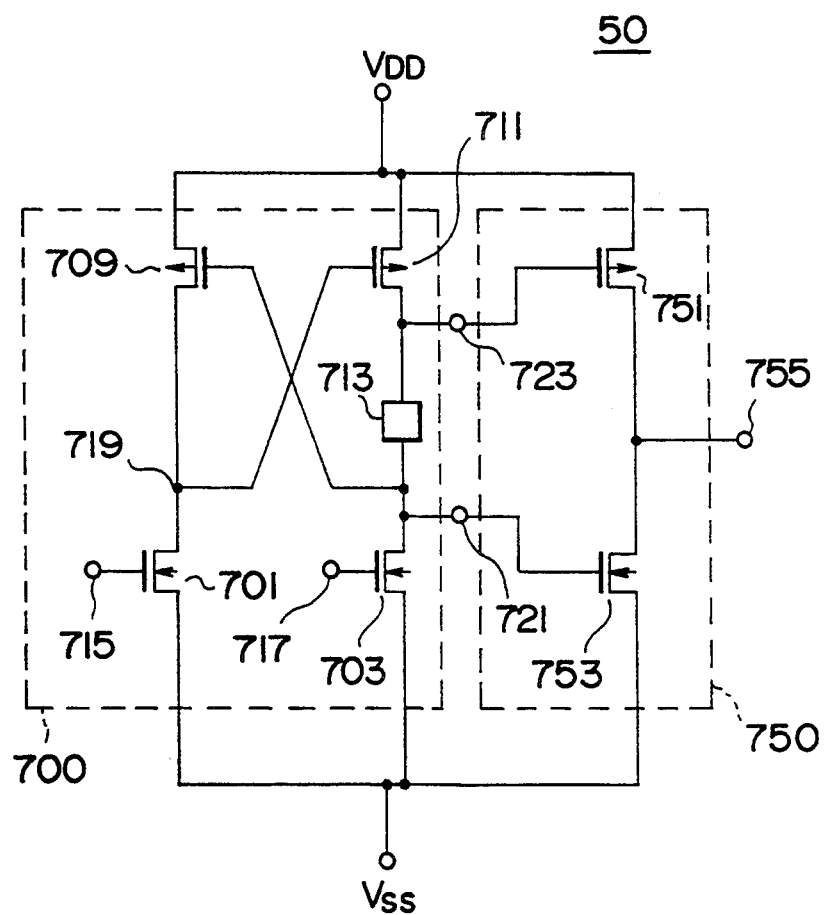
FIG. 5 is a circuit diagram showing a level shifting circuit according to a fourth embodiment of the present invention.

FIG. 5 is a circuit diagram showing a level shifting circuit 50 according to a fourth embodiment of the present invention. The level shifting circuit 50 according to the fourth embodiment will be described below with reference to FIG. 5.

The level shifting circuit 50 according to the fourth embodiment has a circuit configuration of a type wherein the power source voltages $V_{DD}$ and $V_{SS}$ have been replaced with each other and the P-MOS and N-MOS have been replaced with each other from the circuit configuration of the first embodiment. The level shifting circuit 50 according to the fourth embodiment comprises a level converter circuit 700 and an output circuit 750.

The level converter circuit 700 comprises first and second N-MOSs 701 and 703, third and fourth P-MOSs 709 and 711 and a resistance means 713. The source electrodes of the first and second N-MOSs 701 and 703 are both electrically connected to a second power source voltage $V_{SS}$. The gate electrode of the first N-MOS 701 is electrically connected to a first input terminal 715 and the gate electrode of the second N-MOS 703 is electrically connected to a second input terminal 717. The drain electrode of the first N-MOS 701 is electrically connected to the drain electrode of the third P-MOS 709 and the gate electrode of the fourth P-MOS 711 via a first node 719. Further, the drain electrode of the second N-MOS 703 is electrically connected to the gate electrode of the third P-MOS 709, a second node 721 and one of both ends of the resistance means 713. The other end of the resistance means 713 is electrically connected to a third node 723 and the drain electrode of the fourth P-MOS 711. The source electrodes of the third and fourth P-MOSs 709 and 711 are electrically connected in common with a first power source voltage $V_{DD}$.

The output circuit 750 comprises a fifth N-MOS 753 and a sixth P-MOS 751. The source, gate and drain electrodes of the fifth N-MOS 753 are respectively electrically connected to the second power source voltage $V_{SS}$, the second noble 721 and an output terminal 755. The source, drain and gate electrodes of the sixth P-MOS 751 are respectively electrically connected to the first power source voltage $V_{DD}$, the output terminal 755 and the third node 723.

The detailed operation of the level shifting circuit 50 according to the fourth embodiment can be judged from the first embodiment. Therefore, the levels of potentials or voltages at the input/output terminals will be shown in Table 2 given below and the operation of the level shifting circuit 50 will be omitted.

TABLE 2

| First input terminal 715 | Second input terminal 717 | Output terminal 755 |
|---|---|---|
| L | H | $V_{SS}$ |
| H | L | $V_{DD}$ |

The level shifting circuit according to the fourth embodiment has the same effect as that obtained by the level shifting circuit according to the first embodiment.

Figure 6:
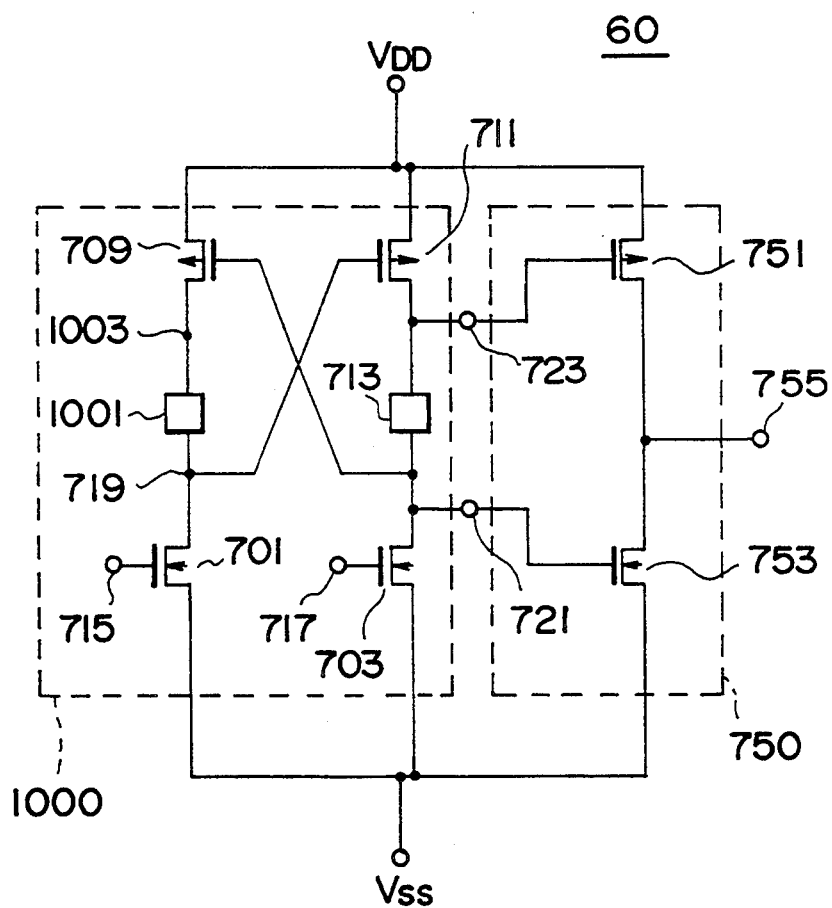
FIG. 6 is a circuit diagram illustrating a level shifting circuit according to a fifth embodiment of the present invention.

FIG. 6 is a circuit diagram illustrating a level shifting circuit 60 according to a fifth embodiment of the present invention. The same elements of structure as those shown in FIG. 5 are identified by the same reference numerals and their description will therefore be omitted.

The level shifting circuit 60 according to the fifth embodiment is identical in structure to the level shifting circuit 40 according to the fourth embodiment except that a resistance means 1001 is provided between a first node 719 and the drain electrode (a fourth node 1003) of a third P-MOS 709. The operation of the level shifting circuit 60 according to the fifth embodiment is substantially identical to that of the level shifting circuit according to the fourth embodiment, and its description will therefore be omitted.

Figure 7:
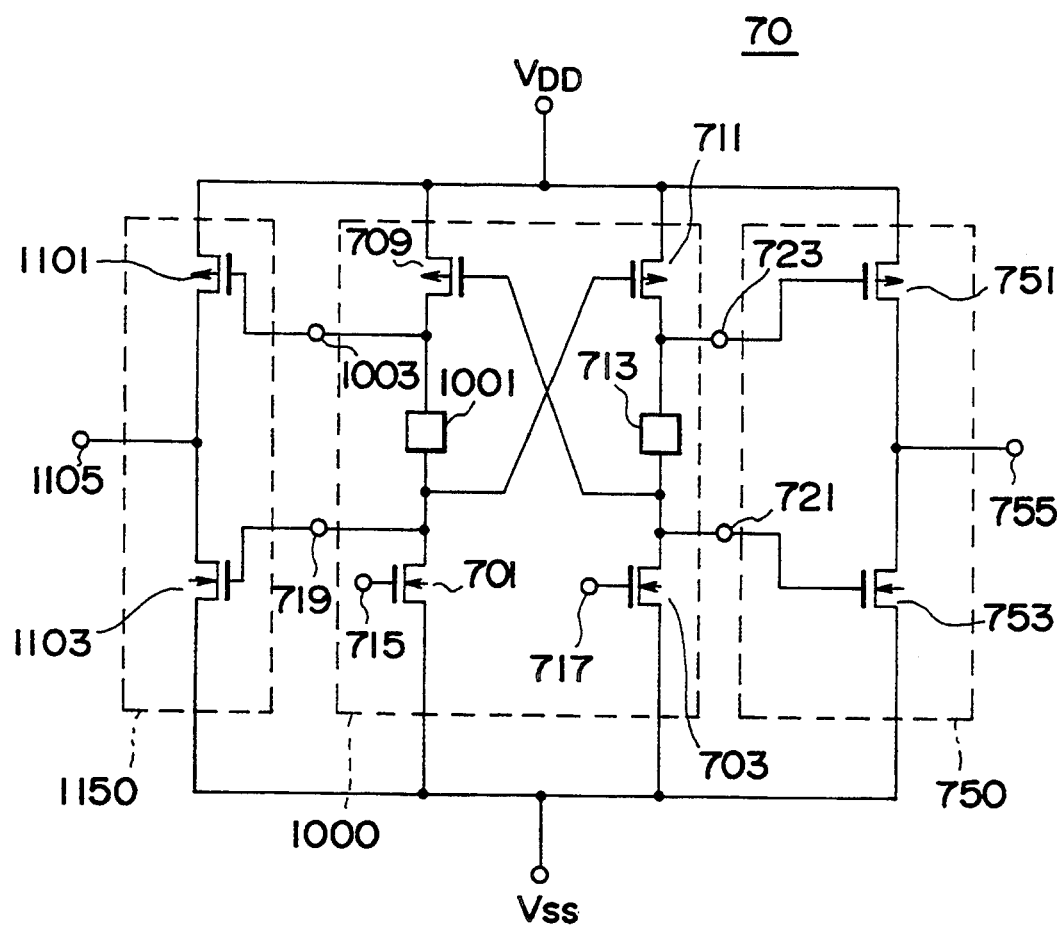
FIG. 7 is a circuit diagram showing a level shifting circuit according to a sixth embodiment of the present invention.

FIG. 7 is a circuit diagram showing a level shifting circuit 70 according to a sixth embodiment of the present invention. The same elements of structure as those shown in FIG. 6 are identified by the same reference numerals and their description will therefore be omitted.

The level shifting circuit 70 according to the sixth embodiment is provided with an output circuit 1150 in addition to the level shifting circuit according to the fifth embodiment. The output circuit 1150 comprises a seventh P-MOS 1101 whose source, drain and gate electrodes are electrically connected to a first power source voltage $V_{DD}$, an output terminal 1105 and a third node 1003 respectively, and an eighth N-MOS 1103 whose source, drain and gate electrodes are electrically connected to a second power source voltage $V_{SS}$, the output terminal 1105 and a first node 719 respectively.

The operation of the level shifting circuit 70 according to the sixth embodiment is shown in Table 3 given below.

TABLE 3

| First input terminal 715 | Second input terminal 717 | Output terminal 755 | Output terminal 1105 |
|---|---|---|---|
| L | H | $V_{SS}$ | $V_{DD}$ |
| H | L | $V_{DD}$ | $V_{SS}$ |

The operation of the level shifting circuit 70 according to the sixth embodiment is basically identical to that of the level shifting circuit 40 according to the third embodiment, and its description will therefore be omitted.

Figure 8:
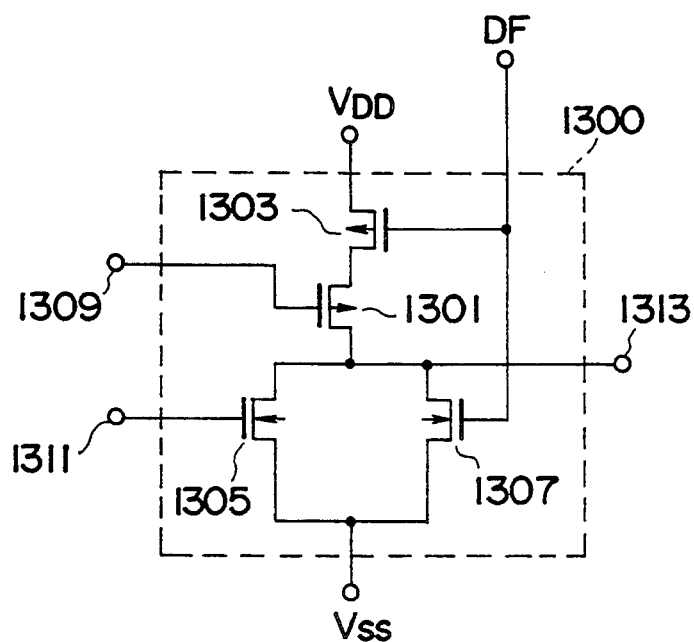
FIG. 8 is a circuit diagram depicting a first output circuit according to the present invention.
Figure 9:
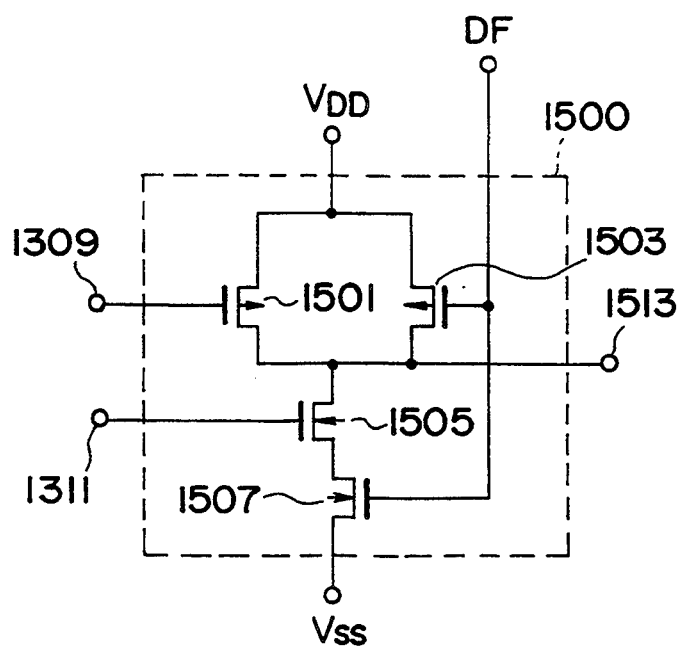
FIG. 9 is a circuit diagram showing a second output circuit according to the present invention.

Modifications of the aforementioned output circuits will next be described. FIGS. 8 and 9 shows the modifications of the output circuits. Either of the output circuit shown in FIGS. 8 and 9 can be replaced by the aforementioned output circuits 150, 650, 750 and 1150. Both of the output circuits shown in FIGS. 8 and 9 respectively have signal input terminals DF in addition to inputs connected to the level shifting circuits. A desired signal can be used depending on the purpose as a signal input to each signal input terminal DF.

FIG. 8 shows a first output circuit. The first output circuit 1300 will be described below with reference to FIG. 8.

The first output circuit 1300 comprises first and second P-MOSs 1301 and 1303 and third and fourth N-MOSs 1305 and 1307. The gate and drain electrodes of the first P-MOS 1301 are electrically connected to a first input terminal 1309 and an output terminal 1313 respectively. The source, drain and gate electrodes of the second P-MOS 1303 are electrically connected to a first power source voltage $V_{DD}$, the source electrode of the first P-MOS 1301 and the signal input terminal DF respectively. The source electrodes of the third and fourth N-MOSs 1305 and 1307 are both electrically connected to a second power source voltage $V_{SS}$ and the drain electrodes thereof are both electrically connected to the output terminal 1313. Further, the gate electrode of the third N-MOS 1305 is electrically connected to a second input terminal 1311 and the gate electrode of the fourth N-MOS 1307 is electrically connected to the signal input terminal DF.

The operation of the first output circuit 1300 will now be described below. The relationship between input signals and an output signal at the time that the first and second input terminals 1309 and 1311 of the first output circuit 1300 are respectively connected to the second and third nodes 121 and 123 of the level shifting circuit shown in FIG. 1, is described below. A detailed description of the operations of the P-MOSs 1301 and 1303 and N-MOSs 1305 and 1307 will be omitted. Let's now assume that signals having the amplitudes corresponding to the $V_{DD}$ and $V_{SS}$ levels are input to the signal input terminal DF.

When the first output circuit 1300 is electrically connected to the level converter circuit 100 as described above, the relationship between the input and output signals is shown in Table 4 given below.

TABLE 4

| First input terminal 115 | Second input terminal 117 | Output terminal DF | Output terminal 1313 |
| --- | --- | --- | --- |
| H | L | $V_{DD}$ | $V_{SS}$ |
| L | H | $V_{DD}$ | $V_{SS}$ |
| H | L | $V_{SS}$ | $V_{SS}$ |
| L | H | $V_{SS}$ | $V_{DD}$ |

FIG. 9 is a circuit diagram showing a second output circuit. The same elements of structure as those shown in FIG. 8 are identified by the same reference numerals and their description will therefore be omitted.

The second output circuit 1500 comprises first and second P-MOSs 1501 and 1503 and third and fourth N-MOSs 1505 and 1507. The source electrodes of the first and second P-MOSs 1501 and 1503 are both electrically connected to a first power source voltage $V_{DD}$ and the drain electrodes thereof are both electrically connected to an output terminal 1513. The gate electrode of the first P-MOS 1501 is electrically connected to a first input terminal 1309 and the gate electrode of the second P-MOS 1503 is electrically connected to an input signal terminal DF. The drain and gate electrodes of the third N-MOS 1505 are electrically connected to the output terminal 1513 and a second input terminal 1311 respectively. The source, gate and drain electrodes of the fourth N-MOS 1507 are electrically connected to a second power source voltage $V_{SS}$, the signal input terminal DF and the source electrode of the third N-MOS 1505 respectively.

The operation of the second output circuit 1500 will now be described below. In a manner similar to the first output circuit 1300, the second output circuit 1500 shows the relationship between input signals and an output signal at the time that the first and second input terminals 1309 and 1311 have been connected to their corresponding second and third nodes 121 and 123 of the level shifting circuit shown in FIG. 1.

Table 5 given below shows the aforementioned relationship. The signal input terminal DF is supplied with signals of the $V_{DD}$ and $V_{SS}$ levels in a manner similar as the first output circuit 1300.

TABLE 5

| First input terminal 115 | Second input terminal 117 | DF | Output terminal 1513 |
| --- | --- | --- | --- |
| H | L | $V_{DD}$ | $V_{SS}$ |
| L | H | $V_{DD}$ | $V_{DD}$ |
| H | L | $V_{SS}$ | $V_{DD}$ |
| L | H | $V_{SS}$ | $V_{DD}$ |

Figure 10:
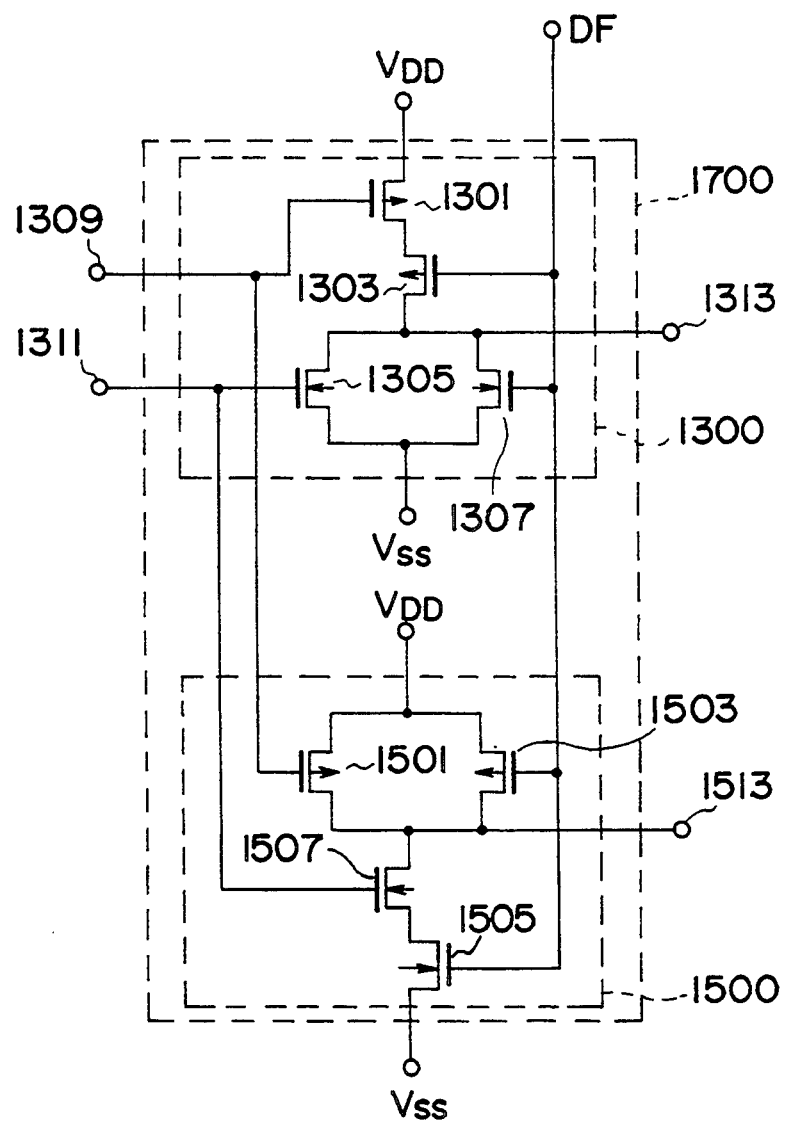
FIG. 10 is a circuit diagram illustrating a third output circuit according to the present invention.

FIG. 10 shows a third output circuit. The third output circuit 1700 comprises a combination of the first output circuit 1300 and the second output circuit 1500. The third output circuit 1700 is identical in circuit configuration and operation to the first and second output circuits and their description will therefore be omitted.

Figure 11:
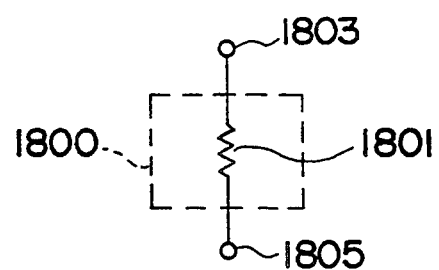
FIG. 11 is a circuit diagram showing a first resistance means according to the present invention.
Figure 12:
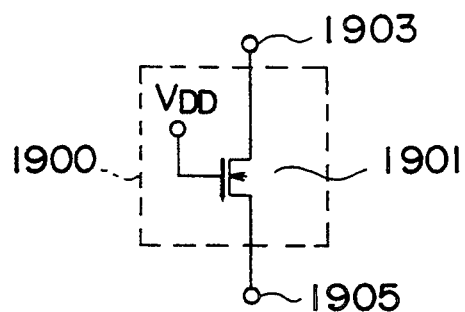
FIG. 12 is a circuit diagram depicting a second resistance means according to the present invention.
Figure 13:
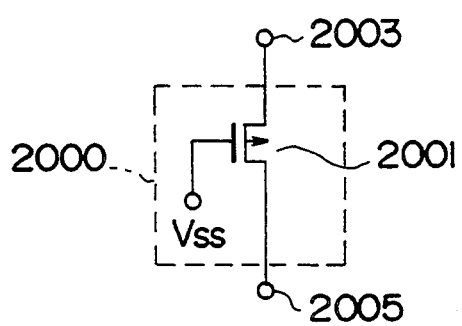
FIG. 13 is a circuit diagram illustrating a third resistance means according to the present invention.
Figure 14:
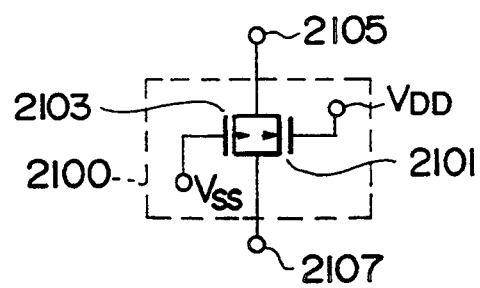
FIG. 14 is a circuit diagram showing a fourth resistance means according to the present invention.

FIGS. 11 through 14 are circuit diagrams showing first through fourth resistance means respectively. A first resistance means 1800 comprises a resistance element 1801 electrically connected between a first terminal 1803 and a second terminal 1805 as shown in FIG. 11. As shown in FIG. 12, a second resistance means 1900 comprises an N-MOS 1901 whose source, drain and gate electrodes are respectively electrically connected to a first terminal 1903, a second terminal 1905 and a first power source voltage $V_{DD}$. As shown in FIG. 13, a third resistance means 2000 comprises a P-MOS 2001 whose source, drain and gate electrodes are respectively electrically connected to a first terminal 2003, a second terminal 2005 and a second power source voltage $V_{SS}$. As illustrated in FIG. 14, a fourth resistance means 2100 comprises an N-MOS 2101 and a P-MOS 2103. The source electrode of the N-MOS 2101 and the drain electrode of the P-MOS 2103 are electrically connected in common to a first terminal 2105. The drain electrode of the N-MOS 2101 and the source electrode of the P-MOS 2103 are electrically connected in common to a second terminal 2107. The gate electrode of the N-MOS 2101 and the gate electrode of the P-MOS 2103 are electrically connected to the first and second power source voltages $V_{DD}$ and $V_{SS}$ respectively.

The aforementioned first through sixth embodiments do not describe specific examples of resistance means. However, the first through fourth resistance means can be employed in the first through sixth embodiments. As the resistance means 113 and 501, the first, second and fourth resistance means 1800, 1900 and 2100 can be used singly or in combination. Further, the first, third and fourth resistance means 1800, 2000 and 2100 can be used singly or in combination as the resistance means 713 and 1001.

As has been described above in detail, a level shifting circuit according to the present invention comprises four FETs and a resistance means. This level shifting circuit has a level converter circuit activated to output a signal from both ends of the resistance means, and an output circuit operated in response to the signal output from the level shifting circuit. The level shifting circuit according to the present invention can be reliably operated irrespective of the magnitude of the value of the resistance means. Further, since the level shifting circuit according to the present invention is reliably operated even if the value of the resistance means increases, the magnitude or value of a through current (consumption current), which is produced from the output circuit, can be reduced.

Table 6 given bellow shows the result of comparison between a conventional level shifting circuit (A) disclosed in Japanese Patent Application Laid-Open Publication No. 268516/90 and the level shifting circuit (B) according to the first embodiment shown in FIG. 1, which has been selected as the level shifting circuit according to the present invention.

TABLE 6

| | Consumption current at the time that output circuit is changed from $V_{SS}$ level to $V_{DD}$ level | Consumption current at the time that output circuit is changed from $V_{DD}$ level to $V_{SS}$ level |
| --- | --- | --- |
| Conventional circuit (A) | 2.00 mA | 1.24 mA |
| Circuit of present invention (B) | 0.84 mA | 0.98 mA |

TABLE 6-continued

| | Consumption current at the time that output circuit is changed from $V_{SS}$ level to $V_{DD}$ level | Consumption current at the time that output circuit is changed from $V_{DD}$ level to $V_{SS}$ level |
|---|---|---|
| B/A | about 42% | about 79% |

In the level shifting circuit according to the present invention as is understood from Table 6, the ratio of a through current (consumption current) flowing through the level shifting circuit of the present invention at the time that the level of a signal output from the output circuit is changed from the $V_{SS}$ level to the $V_{DD}$ level and a through current (consumption current) flowing through the conventional level shifting circuit at the time that its level is changed in the same manner as described above reaches about 42%. Further, the ratio of both through currents (consumption currents) at the time that the signal level is changed from the $V_{DD}$ level to the $V_{SS}$ level is brought to about 79%. It is thus understood that the magnitude of the through current is reduced as compared with the conventional level shifting circuit.

Further, the level shifting circuit according to the present invention can be comprised of four FETs as compared with the conventional level shifting circuit comprised of six FETs. It is therefore possible to reduce the area of an integrated circuit.

Having now fully described the invention, it will be apparent to those skilled in the art that many changes and modifications can be made without departing from the spirit or scope of the invention as set forth herein.

What is claimed is:

1. A level shifting circuit comprising:
   a first voltage terminal for supplying a first voltage level;
   a second voltage terminal for supplying a second voltage level;
   a first input terminal for receiving a first input signal;
   a second input terminal for receiving a second input signal;
   an output terminal;
   a level converter circuit including,
      first, second and third nodes,
      a first field effect transistor having a first electrode coupled for receiving the first voltage level, a second electrode connected to the first node and a control electrode connected to said first input terminal,
      a second field effect transistor having a first electrode coupled for receiving the first voltage level, a second electrode connected to the second node and a control electrode connected to said second input terminal,
      a third field effect transistor having a first electrode coupled for receiving the second voltage level, a second electrode connected to the first node and a control electrode connected to the second node,
      a resistive element connected between the second and third nodes, and
      a fourth field effect transistor having a first electrode coupled for receiving the second voltage level, a second electrode connected to the third node and a control electrode connected to the first node; and
   an output circuit including,
      a fifth field effect transistor having a first electrode coupled for receiving the first voltage level, a second electrode connected to said output terminal and a control electrode connected to the second node, and
      a sixth field effect transistor having a first electrode coupled for receiving the second voltage level, a second electrode connected to said output terminal and a control electrode connected to the third node.

2. A level shifting circuit according to claim 1, wherein said output circuit further comprises:
   a seventh field effect transistor having a first electrode connected to said first voltage terminal, a second electrode connected to the first terminal of the fifth filed effect transistor and a control electrode coupled for receiving a control signal, and
   an eighth field effect transistor having a first electrode coupled for receiving the second voltage level, a second electrode connected to said output terminal and a control electrode coupled for receiving the control signal.

3. A level shifting circuit according to claim 2, wherein said output circuit further comprises,
   an additional output terminal,
   a ninth field effect transistor having a first electrode coupled for receiving the first voltage level, a second electrode connected to the additional output terminal and a control electrode connected to the second node,
   a tenth field effect transistor having a first electrode coupled for receiving the second voltage level, a second electrode connected to the additional output terminal and a control electrode connected to the third node,
   an eleventh field effect transistor having a first electrode coupled for receiving the first voltage level, a second electrode connected to the additional output terminal and a control electrode coupled for receiving the control signal, and
   a twelfth field effect transistor having a first electrode connected to said second voltage terminal, a second electrode connected to the first terminal of the sixth field effect transistor and a control electrode coupled for receiving the control signal.

4. A level shifting circuit according to claim 1, wherein said output circuit further comprises,
   a seventh field effect transistor having a first electrode coupled for receiving the first voltage level, a second electrode connected to said output terminal and a control electrode coupled for receiving a control signal, and
   an eighth field effect transistor having a first electrode connected to said second voltage terminal, a second electrode connected to the first terminal of the sixth field effect transistor and a control electrode coupled for receiving the control signal.

5. A level shifting circuit according to claim 1, wherein said resistive element includes a resistor connected between the second and third nodes.

6. A level shifting circuit according to claim 1, wherein said resistive element includes a p-channel type field effect transistor having a first electrode connected to the second node, a second electrode connected to the third node and a control electrode coupled for receiving the first voltage level.

7. A level shifting circuit according to claim 1, wherein said resistive element includes an n-channel type field effect transistor having a first electrode connected to the second node, a second electrode connected to the third node and a control electrode coupled for receiving the second voltage level.

8. A level shifting circuit according to claim 1, wherein said resistive element includes,
a p-channel type field effect transistor having a first electrode connected to the second node, a second electrode connected to the third node and a control electrode coupled for receiving the first voltage level, and
an n-channel type field effect transistor having a first electrode connected to the second node, a second electrode connected to the third node and a control electrode coupled for receiving the second voltage level.

9. A level shifting circuit comprising:
a first voltage terminal for supplying a first voltage level;
a second voltage terminal for supplying a second voltage level;
a first input terminal for receiving a first input signal;
a second input terminal for receiving a second input signal;
an output terminal; a level converter circuit including,
first, second, third and fourth nodes,
a first field effect transistor having a first electrode coupled for receiving the first voltage level, a second electrode connected to the first node and a control electrode connected to said first input terminal,
a second field effect transistor having a first electrode coupled for receiving the first voltage level, a second electrode connected to the second node and a control electrode connected to said second input terminal,
a first resistive element connected between the first and third nodes,
a third field effect transistor having a first electrode coupled for receiving the second voltage level, a second electrode connected to the third node and a control electrode connected to the second node,
a second resistive element connected between the second and fourth nodes, and
a fourth field effect transistor having a first electrode coupled for receiving the second voltage level, a second electrode connected to the fourth node and a control electrode connected to the first node; and
an output circuit including,
a fifth field effect transistor having a first electrode coupled for receiving the first voltage level, a second electrode connected to said output terminal and a control electrode connected to the second node, and
a sixth field effect transistor having a first electrode coupled for receiving the second voltage level, a second electrode connected to said output terminal and a control electrode connected to the fourth node.

10. A level shifting circuit according to claim 9, further comprising an additional output circuit including,
a first additional output terminal,
a seventh field effect transistor having a first electrode coupled for receiving the first voltage level, a second electrode connected to the first additional output terminal and a control electrode connected to the second node, and
an eighth field effect transistor having a first electrode coupled for receiving the second voltage level, a second electrode connected to the first additional output terminal and a control electrode connected to the fourth node.

11. A level shifting circuit according to claim 9, wherein said output circuit further comprises,
a seventh field effect transistor having a first electrode connected to said first voltage terminal, a second electrode connected to the first terminal of the fifth field effect transistor and a control electrode coupled for receiving a control signal, and
an eighth field effect transistor having a first electrode coupled for receiving the second voltage level, a second electrode connected to said output terminal and a control electrode coupled for receiving the control signal.

12. A level shifting circuit according to claim 11, wherein said output circuit further comprises,
an additional output terminal,
a ninth field effect transistor having a first electrode coupled for receiving the first voltage level, a second electrode connected to the additional output terminal and a control electrode connected to the second node,
a tenth field effect transistor having a first electrode coupled for receiving the second voltage level, a second electrode connected to the additional output terminal and a control electrode connected to the third node,
an eleventh field effect transistor having a first electrode coupled for receiving the first voltage level, a second electrode connected to the additional output terminal and a control electrode coupled for receiving the control signal, and
a twelfth field effect transistor having a first electrode connected to said second voltage terminal, a second electrode connected to the first terminal of the sixth field effect transistor and a control electrode coupled for receiving the control signal.

13. A level shifting circuit according to claim 9, wherein said output circuit further comprises,
a seventh field effect transistor having a first electrode coupled for receiving the first voltage level, a second electrode connected to said output terminal and a control electrode coupled for receiving a control signal, and
an eighth field effect transistor having a first electrode connected to said second voltage terminal, a second electrode connected to the first terminal of the sixth field effect transistor and a control electrode coupled for receiving the control signal.

14. A level shifting circuit according to claim 10, wherein the additional output circuit further comprises,
a ninth field effect transistor having a first electrode connected to said first voltage terminal, a second electrode connected to the first terminal of the seventh field effect transistor and a control electrode coupled for receiving a control signal, and
a tenth field effect transistor having a first electrode coupled for receiving the second voltage level, a second electrode connected to the first additional output terminal and a control electrode coupled for receiving the control signal.

15. A level shifting circuit according to claim 14, wherein the additional output circuit further comprises, a second additional output signal, an eleventh field effect transistor having a first electrode coupled for receiving the first voltage level, a second electrode connected to the second additional output terminal and a control electrode connected to the first node, a twelfth field effect transistor having a first electrode coupled for receiving the second voltage level, a second electrode connected to the second additional output terminal and a control electrode connected to the third node, a thirteenth field effect transistor having a first electrode coupled for receiving the first voltage level, a second electrode connected to the second additional output terminal and a control electrode coupled for receiving the control signal, and a fourteenth field effect transistor having a first electrode connected to said second voltage terminal, a second electrode connected to the first terminal of the eighth field effect transistor and a control electrode coupled for receiving the control signal.

16. A level shifting circuit according to claim 10, wherein the additional output circuit further comprises, a ninth field effect transistor having a first electrode coupled for receiving the first voltage level, a second electrode connected to the first additional output terminal and a control electrode coupled for receiving a control signal, and a tenth field effect transistor having a first electrode connected to said second voltage terminal, a second electrode connected to the first terminal of the eighth field effect transistor and a control electrode coupled for receiving the control signal.

17. A level shifting circuit including first and second input terminals for respectively receiving first and second complementary input signals both of which have a first signal level and an output terminal for outputting an output signal having a second signal level which is different from the first signal level, the level shifting circuit comprising:

first, second and third nodes;

a first input circuit coupled to the first input terminal and the first node for bringing a potential level on the first node to a first potential level when the first complementary input signal is in a first state;

a second input circuit coupled to the second input terminal and the second node for bringing a potential level on the second node to the first potential level when the second complementary input signal is in the first state;

a first adjust circuit coupled to the first and second nodes for bringing the potential level on the first node to a second potential level in response to the potential level on the second node;

a second adjust circuit coupled to the first and third nodes for bringing a potential level on the third node to the second potential level in response to the potential level on the first node;

a third adjust circuit coupled to the second and third nodes for bringing the potential level on the second node to the potential level on the third node with a predetermined delay;

a first output circuit coupled to the second node and the output terminal for bringing a potential level on the output terminal to the first potential level in response to the potential level on the second node; and a second output circuit coupled to the third node and the output terminal for bringing the potential level on the output terminal to the second potential level in response to the potential level on the third node.

18. A level shifting circuit according to claim 17, wherein said first input circuit comprises a first field effect transistor having a first electrode coupled for receiving the first potential level, a second electrode connected to the first node and a control electrode connected to the first input terminal, and wherein said second input circuit comprises a second field effect transistor having a first electrode coupled for receiving the first potential level, a second electrode connected to the second node and a control electrode connected to said second input terminal.

19. A level shifting circuit according to claim 17, wherein said first adjust circuit comprises a third field effect transistor having a first electrode coupled for receiving the second potential level, a second electrode connected to the first node and a control electrode connected to the second node and wherein said second adjust circuit comprises a fourth field effect transistor having a first electrode coupled for receiving the second potential level, a second electrode connected to the third node and a control electrode connected to the first node.

20. A level shifting circuit according to claim 17, wherein said first output circuit comprises a fifth field effect transistor having a first electrode coupled for receiving the first potential level, a second electrode connected to the output terminal and a control electrode connected to the second node, and wherein said first output circuit comprises a sixth field effect transistor having a first electrode coupled for receiving the second potential level, a second electrode connected to said output terminal and a control electrode connected to the third node.

21. A level shifting circuit according to claim 17, wherein said third adjust circuit comprises a resistive element connected between the second and third nodes.

22. A level shifting circuit including first and second input terminals for respectively receiving first and second complementary input signals both of which have a first signal level and an output terminal for outputting an output signal having a second signal level which is different from the first signal level, the level shifting circuit comprising:

first, second, third and fourth nodes;

a first input circuit coupled to the first input terminal and the fist node for bringing a potential level on the first node to a first potential level when the first complementary input signal is in a first state;

a second input circuit coupled to the second input terminal and the second node for bringing a potential level on the second node to the first potential level when the second complementary input signal is in the first state;

a first adjust circuit coupled to the second and fourth nodes for bringing a potential level on the fourth node to a second potential level in response to the potential level on the second node;

a second adjust circuit coupled to the first and third nodes for bringing a potential level on the third node to the second potential level in response to the potential level on the first node;

a third adjust circuit coupled to the second and fourth nodes for bringing the potential level on the second node to the potential level on the fourth node with a first delay;

a fourth adjust circuit coupled to the first and third nodes for bringing the potential level on the first node to the potential level on the third node with a first delay;

a first output circuit coupled to the second node and the output terminal for bringing a potential level on the output terminal to the first potential level in response to the potential level on the second node; and a second output circuit coupled to the fourth node and the output terminal for bringing the potential level on the output terminal to the second potential level in response to the potential level on the fourth node.

23. A level shifting circuit according to claim 22, further comprising:

an additional output terminal for outputting another output signal having the second signal level;

a third output circuit coupled to the first node and the additional output terminal for bringing a potential level on the additional output terminal to the first potential level in response to the potential level on the first note; and a fourth output circuit coupled to the third node and the additional output terminal for bringing the potential level on the additional output terminal to the second potential Level in response to the potential level on the third node.

* * * * *